United States Patent
So et al.

(10) Patent No.: US 8,286,109 B1
(45) Date of Patent: Oct. 9, 2012

(54) METHOD AND APPARATUS FOR PERFORMING INCREMENTAL DELAY ANNOTATION

(75) Inventors: Derek So, North York (CA); Chris Wysocki, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/118,471

(22) Filed: May 30, 2011

Related U.S. Application Data

(63) Continuation of application No. 11/803,988, filed on May 16, 2007, now Pat. No. 8,015,524.

(51) Int. Cl.
*G06F 9/45* (2006.01)
*G06F 17/50* (2006.01)
*G06F 9/455* (2006.01)

(52) U.S. Cl. .................. 716/108; 716/103; 716/132

(58) Field of Classification Search .............. 716/103, 716/108, 132
See application file for complete search history.

(56) References Cited

U.S. PATENT DOCUMENTS

| | | | |
|---|---|---|---|
| 5,508,937 | A | 4/1996 | Abato et al. |
| 5,867,396 | A | 2/1999 | Parlour |
| 5,949,690 | A | 9/1999 | Lawman |
| 6,442,738 | B1 | 8/2002 | Brehmer |
| 6,851,095 | B1 | 2/2005 | Srinivasan et al. |
| 7,290,240 | B1 | 10/2007 | Lam-Leventis et al. |
| 7,451,417 | B1 | 11/2008 | Campbell et al. |
| 8,015,524 | B1 | 9/2011 | So et al. |
| 2002/0023252 | A1 | 2/2002 | Lee et al. |
| 2002/0162086 | A1* | 10/2002 | Morgan ................ 716/18 |
| 2005/0066296 | A1 | 3/2005 | Visweswariah |
| 2005/0172251 | A1 | 8/2005 | Chang et al. |
| 2006/0294478 | A1 | 12/2006 | Dutta et al. |

* cited by examiner

*Primary Examiner* — Suresh Memula
(74) *Attorney, Agent, or Firm* — L. Cho

(57) ABSTRACT

A method for designing a system on a target device includes identifying components and routing connections impacted by incremental design changes made to a system design. New information is computed to annotate delays for the components and routing connections identified. Delays previously computed for components and routing connections are utilized to annotate delays for components and routing connections that have not been impacted by the changes made to the system design.

20 Claims, 8 Drawing Sheets

METHOD AND APPARATUS FOR PERFORMING INCREMENTAL DELAY ANNOTATION

RELATED APPLICATION

This application is a continuation of and claims priority and benefit to U.S. application Ser. No. 11/803,988 filed on Mar. 16, 2007 entitled "Method and Apparatus for Performing Incremental Delay Annotation" which claims priority to provisional U.S. patent application Ser. No. 60/919,604 filed Mar. 23, 2007, entitled "Method and Apparatus for Performing Incremental Delay Annotation", the full and complete subject matter of which is hereby expressly incorporated by reference in its entirety.

TECHNICAL FIELD

Embodiments of the present invention relate to tools such as electronic design automation (EDA) tools for designing systems on target devices such as field programmable gate arrays (FPGAs). More specifically, embodiments of the present invention relates to a method and apparatus for performing incremental delay annotation.

BACKGROUND

Logic devices such as FPGAs are used to implement large systems that include million of gates and megabits of embedded memory. The complexity of large systems often requires the use of EDA tools to create and optimize a design for the system onto physical target devices. Among the procedures performed by EDA tools in a computer aided design (CAD) flow are synthesis, mapping, placement, routing, delay annotation, and timing analysis.

Delay annotation may involve performing logic cell delay annotation where delays related to a logic cell are computed based on the configuration and settings of the cell. Delay annotation may also involve performing routing delay annotation where delays related to a routing connection are computed based on the structure and configuration of the routing connection with respect to other routing connections on a netlist. Routing delay annotation often involves running a modeling program in order to simulate the system design.

When changes are made to a system design, the system design is often re-annotated in its entirety. When only incremental changes are made to a system design, having to re-annotate an entire system design may require a significant amount of additional time that impacts the overall compile time of a system design.

Thus, what is needed is an efficient and effective method and apparatus for performing incremental delay annotation.

SUMMARY

According to an embodiment of the present invention, parts of a netlist that include components and routing connections that are impacted by incremental design changes made to a system design are identified. New information to annotate delays for the components and routing connections impacted by the incremental design changes are computed. Previously computed delays for components and routing connections may be used to annotate delays for components and routing connections that have not been impacted by the changes made to the system design. Compile time may be reduced by detecting and re-annotating the differences between a first and second netlist of a system design as oppose to re-annotating the second system design in its entirety. Parasitic capacitive loading may be considered in determining the interdependence between routing connections and the impact of incremental design changes on delay of the second system design.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
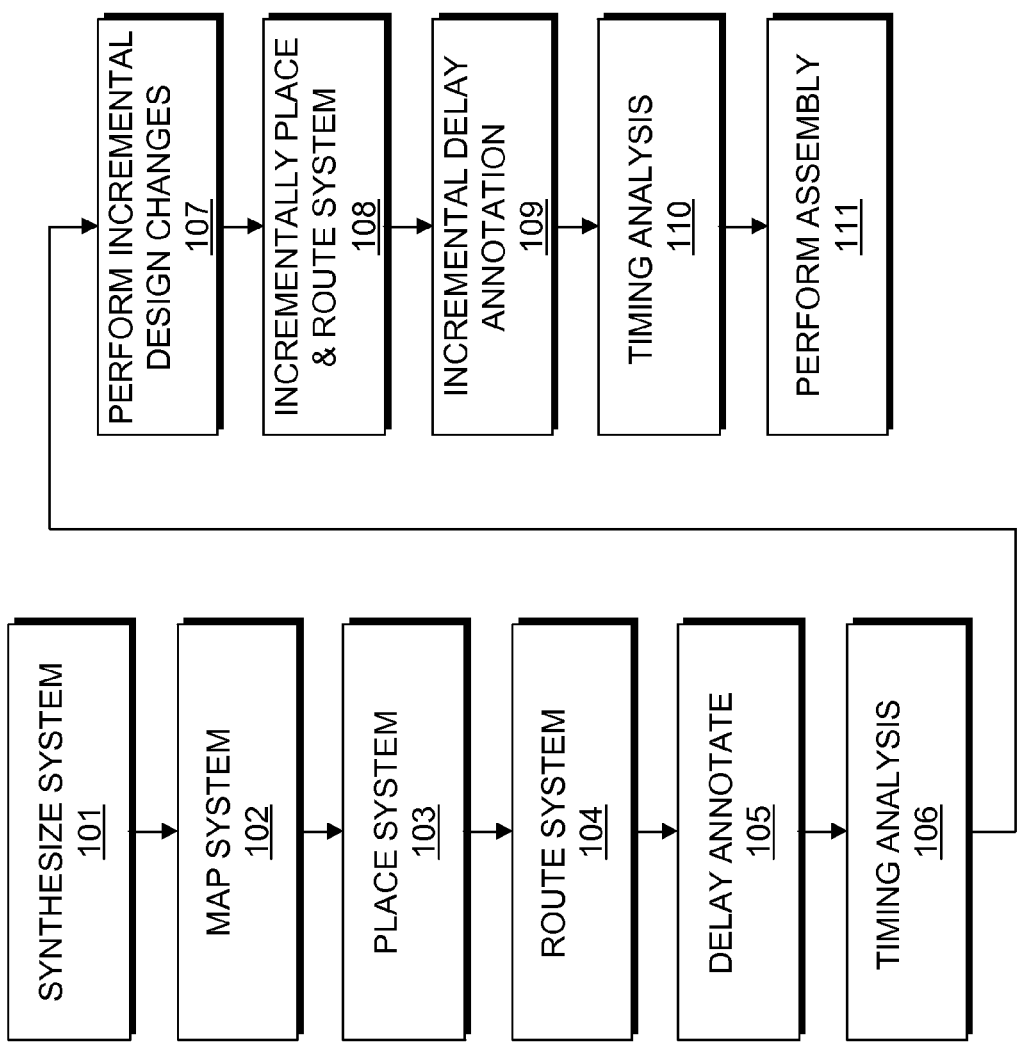
FIG. 1 is a flow chart illustrating a method for designing a system on a target device according to an exemplary embodiment of the present invention.

FIG. 1 is a flow chart illustrating a method for designing a system on a target device according to an embodiment of the present invention. The procedure shown in FIG. 1 may be performed by an EDA tool implemented on a computer system. At 101, the system is synthesized. Synthesis includes generating a logic design of the system to be implemented. The design of the system may be described at a gate level or in a more abstract level. The design of the system may be described in terms of a hardware description language (HDL) such as VHDL or Verilog. The target device may be a structured ASIC, FPGA, programmable logic device (PLD), or other target device. According to an embodiment of the present invention, synthesis generates an optimized logical representation of the system from a HDL design definition. The optimized logical representation of the system may include a representation that has a minimized number of functional blocks such as logic gates, logic elements, and registers required for the system.

At 102, technology mapping is performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, a netlist is generated from mapping. This netlist may be an optimized technology-mapped netlist generated from the HDL.

At 103, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form the logic clusters present on the target device.

At 104, it is determined which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 105, delay annotation is performed. According to an embodiment of the present invention, delay annotation involves performing logic cell delay annotation and routing delay annotation. Logic cell delay annotation is a procedure where delays related to a cell (component) are computed based on the configuration and settings of the cell. Logic cell delay annotation may involve referencing a look up table that includes delay information for various types of cells. Routing delay annotation is a procedure where delays related to a routing connection are computed based on the structure and configuration of the routing connection with respect to other routing connections on a netlist. The delays may be computed based on parasitic capacitive loading from other routing connections in the routing netlist. Routing delay annotation may involve running a modeling program in order to simulate the system design. According to an embodiment of the present invention, a description of a resource, its fanout, and its input wave form are provided to the modeling program. The modeling program computes the delay through the resource and an output waveform from the resource.

At 106, a timing analysis is performed. According to an embodiment of the present invention, the timing analysis determines whether the placement and routing performed on the system design satisfies timing constraints of the system.

At 107, incremental design changes are made to the system design. According to an embodiment of the present invention, incremental changes are made to the placement and routing of components in the system design based upon the results of timing analysis. Layout-driven optimizations may be applied to perturb the netlist to reduce one or more critical paths. The netlist may be perturbed by the EDA tool performing the synthesis, mapping, placement, and routing. Alternatively, the netlist may be perturbed by a user of the EDA tool, or by a third party. Perturbing the netlist may include adding, deleting, or moving components, and/or re-routing components.

At 108, incremental placement and routing is performed. According to an embodiment of the present invention, incremental placement and routing involves evaluating resources on the target device that have architectural violations or illegalities from the incremental design changes made at 107 and perturbs the preferred placement locations and preferred selection of routing as little as possible to ensure that the final placement and routing respects all architectural constraints. For example, incremental placement may attempt to identify non-critical logic elements that may be moved from their preferred locations to resolve architectural violations in order that truly critical elements may stay at their preferred locations.

At 109, incremental delay annotation is performed. According to an embodiment of the present invention, incremental delay annotation involves identifying components and routing connections impacted by incremental design changes made to a system design, and computing new information to annotate delays for the components and routing connections identified while utilizing delays previously computed for components and routing connections to annotate delays for components and routing connections that have not been impacted by the changes made to the system design.

At 110, a timing analysis is performed. According to an embodiment of the present invention, the timing analysis determines whether the placement and routing performed on the system design satisfies timing constraints of the system. According to an embodiment of the present invention, if the timing constraints of the system are not satisfied, control may return to procedure 107 or alternatively generate a notification to a user of the EDA tool.

At 111, an assembly procedure is performed. The assembly procedure involves creating a data file that includes some of the information determined by the procedure described by 101-110. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

According to an embodiment of the present invention, delay information from delay annotation and incremental delay annotation is stored in a timing database. The delay information from the timing database may be used by other timing driven CAD or EDA tools. Before the timing database is used, it is validated for consistency with a current system design netlist. A checksum may be generated to represent the netlist used by delay annotation and stored in the timing database. When the timing database is accessed for use, a new checksum is generated from the netlist and compared against the checksum stored in the timing database. If the netlist is modified by an incremental change in placement or routing, the checksum will be different and the timing database will be invalidated. Incremental delay annotation may be invoked to re-synchronize the timing database to the netlist for the new or modified system design. The timing database is allowed to be used if the calculated checksum is identical to the stored checksum.

Figure 2:
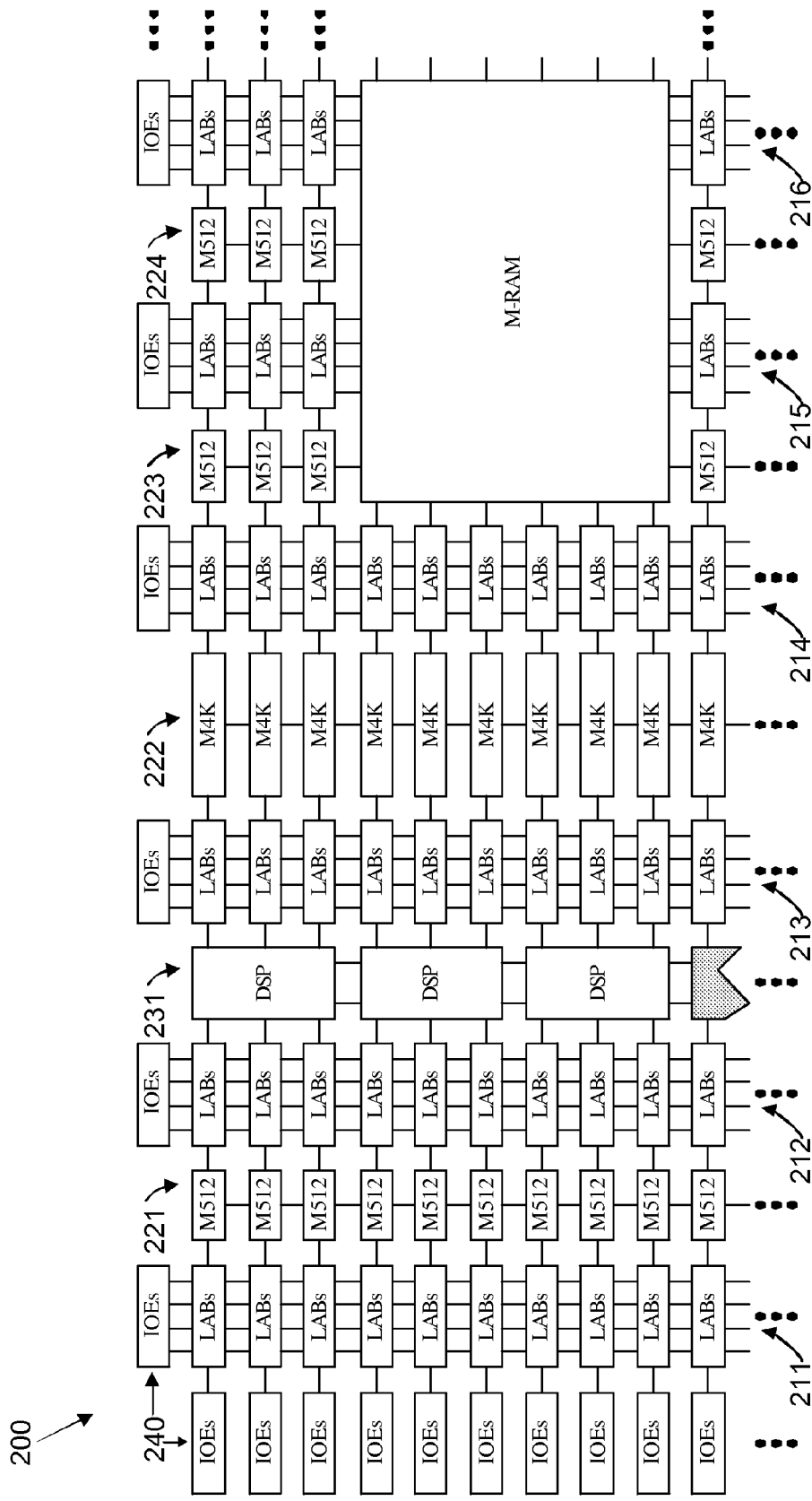
FIG. 2 illustrates an exemplary target device according to an exemplary embodiment of the present invention.

FIG. 2 illustrates an exemplary target device 200 in which a system may be implemented on 200 utilizing an FPGA according to an embodiment of the present invention. According to one embodiment, the target device 200 is a chip having a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ II manufactured by Altera® Corporation. LABs are grouped into rows and columns across the target device 200. Columns of LABs are shown as 211-216. It should be appreciated that the logic block may include additional or alternate components.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The target device 200 also includes a plurality of row interconnect lines ("H-type wires") (not shown) that span fixed distances. Dedicated row interconnect lines, route signals to and from LABs, DSP blocks, and memory blocks within the same row. The row interconnect lines may span a distance of up to four, eight, and twenty-four LABs respectively, and are used for fast row connections in a four-LAB, eight-LAB, and twenty-four-LAB. The row interconnects may drive and be driven by LABs, DSP blocks, RAM blocks, and horizontal IOEs.

The target device 200 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. The column interconnect lines may traverse a distance of four, eight, and sixteen blocks respectively, in a vertical direction.

According to an embodiment of the present invention, the cells or components referred to in FIG. 1 may include any of the LABs, memory blocks, DSP blocks, or other resource on the target device 200. Furthermore, the routing connections referred to in FIG. 1 may include any of the LAB local interconnect lines, row interconnect lines, column interconnect lines, or other routing resource on the target device 200. The cells/components and routing connections may collectively be referred to as resources on a target device.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, Stratix™ Cyclone™, Stratix™ II, and Cyclone™ II families of chips and those employed by Xilinx® Inc. in its Virtex™ and Virtex™ II, and Virtex IV™ line of chips.

Figure 3:
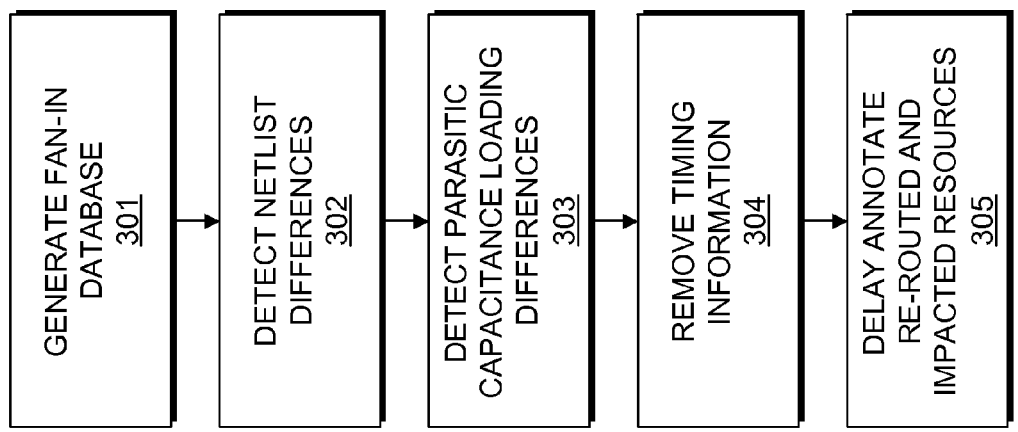
FIG. 3 is a flow chart illustrating a method for incremental delay annotation according to an exemplary embodiment of the present invention.

FIG. 3 is a flow chart illustrating a method for incremental delay annotation according to an exemplary embodiment of the present invention. The procedures illustrated in FIG. 3 may be utilized to implement 109 shown in FIG. 1. At 301, a fan-in database is generated. According to an embodiment of the present invention, the fan-in database identifies a mapping from a first routing resource to all the routing resources that can potential drive the first routing resource. According to one embodiment, the fan-in database is designed to achieve fast look-ups to help reduce the run time of performing incremental delay annotation. Each routing resource may be indexed such that its entry can be found in a number of CPU instructions that is bound by a constant. Furthermore, the accompanying set of resource identifiers that define the fan-in set of a looked up routing resource may be stored in a contiguous memory chunk to speed up brining an entire set into the CPU's cache upon the access of the fist fan-out entry.

At 302, netlist difference detection is performed. According to an embodiment of the present invention, netlist difference detection involves comparing the structure of a first (base) netlist with a second (new) netlist to determine a difference set. The routing connections that are present in the first netlist, but not in the second netlist may be referred to as "ripped-up connections". The routing connections that are present in the second netlist, but not in the first netlist may be referred to as "re-routed connections".

At 303, parasitic loading difference detection is performed. According to an embodiment of the present invention, parasitic loading difference detection is used to identifying whether components and routing connections is impacted by incremental changes made to a system design. In one embodiment, a routing connection that has been modified in the system design is identified. The modified routing connection may have been removed from the first netlist or alternatively added to the first netlist. A resource outside the routing connection that is capable of driving a resource on the routing connection is identified. The resource on the routing connection that is driven may be a multiplexer (MUX) controlled by a RAM bit. All components and routing connections driven by the resource outside the routing connection are designated as having a difference in parasitic capacitive loading.

According to an embodiment of the present invention, the effect of parasitic capacitive loading of each ripped-up connection and each re-routed connection is determined. Determining whether a ripped-up connection has affected parasitic capacitive loading may be achieved by determining whether any fanins to a removed routing connection share a RAM bit with the removed routing connection. Determining whether a re-routed connection has affected parasitic capacitive loading may be achieved by determining whether any fanins to an added routing connection of a system design share a RAM bit with the added routing connection.

At 304, timing information is removed for the routing connections that have been removed from the first netlist (ripped-up connections) and for components connected to those routing connections.

At 305, delay annotation is performed on the re-routed connections and connections impacted by the parasitic capacitive loading of the re-routed and ripped-up connections. Delay annotation is also performed on the components connected to the re-routed connections and connections impacted by the parasitic capacitive loading. According to an embodiment of the present invention, routing connection impacted by parasitic capacitive loading and components connected to routing connections that are impacted are re-annotated. According to an embodiment of present invention, the delay annotation may be performed using the procedure described with reference to 105 in FIG. 1.

Figure 4:
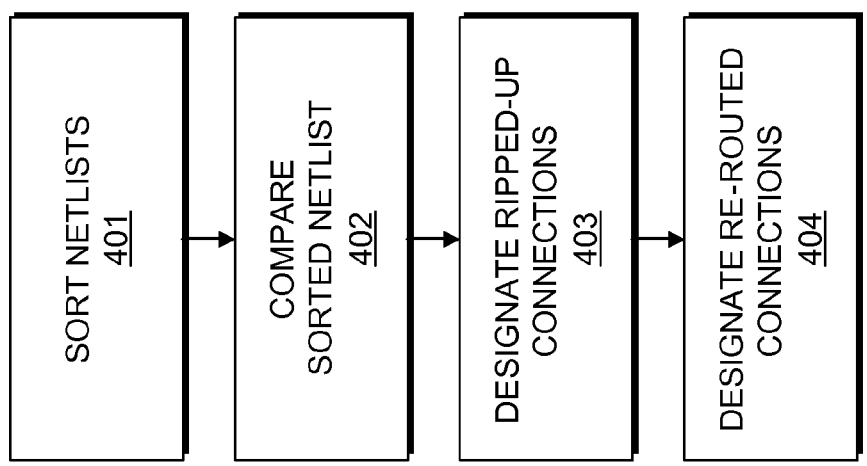
FIG. 4 is a flow chart illustrating a method for performing netlist difference detection according to an exemplary embodiment of the present invention.

FIG. 4 is a flow chart illustrating a method for performing netlist difference detection according to an embodiment of the present invention. According to an embodiment of the present invention, the procedures illustrated in FIG. 4 may be utilized to implement 302 shown in FIG. 3. At 401, a timing netlist for a first system design (original or base system design) and a timing netlist for the second system design (new or incrementally changed system design) are sorted. According to an embodiment of the present invention, the fan-out connections are sorted. The sorting may be performed based on unique resource identifiers.

At 402, a comparison is performed on the sorted netlists to determine routing connections and components that have been removed from the first netlist and routing connections and components that have been added to the first netlist on the second netlist. According to an embodiment of the present invention, the identity, location, connection data of the components and routing connection from the first and second netlists are compared.

At 403, routing connections that are identified to be in the first netlist but not in the second netlist are designated as ripped-up connections.

At 404, routing connections that are identified to be in the second netlist but not in the first netlist are designated as re-routed connections.

Figure 5:
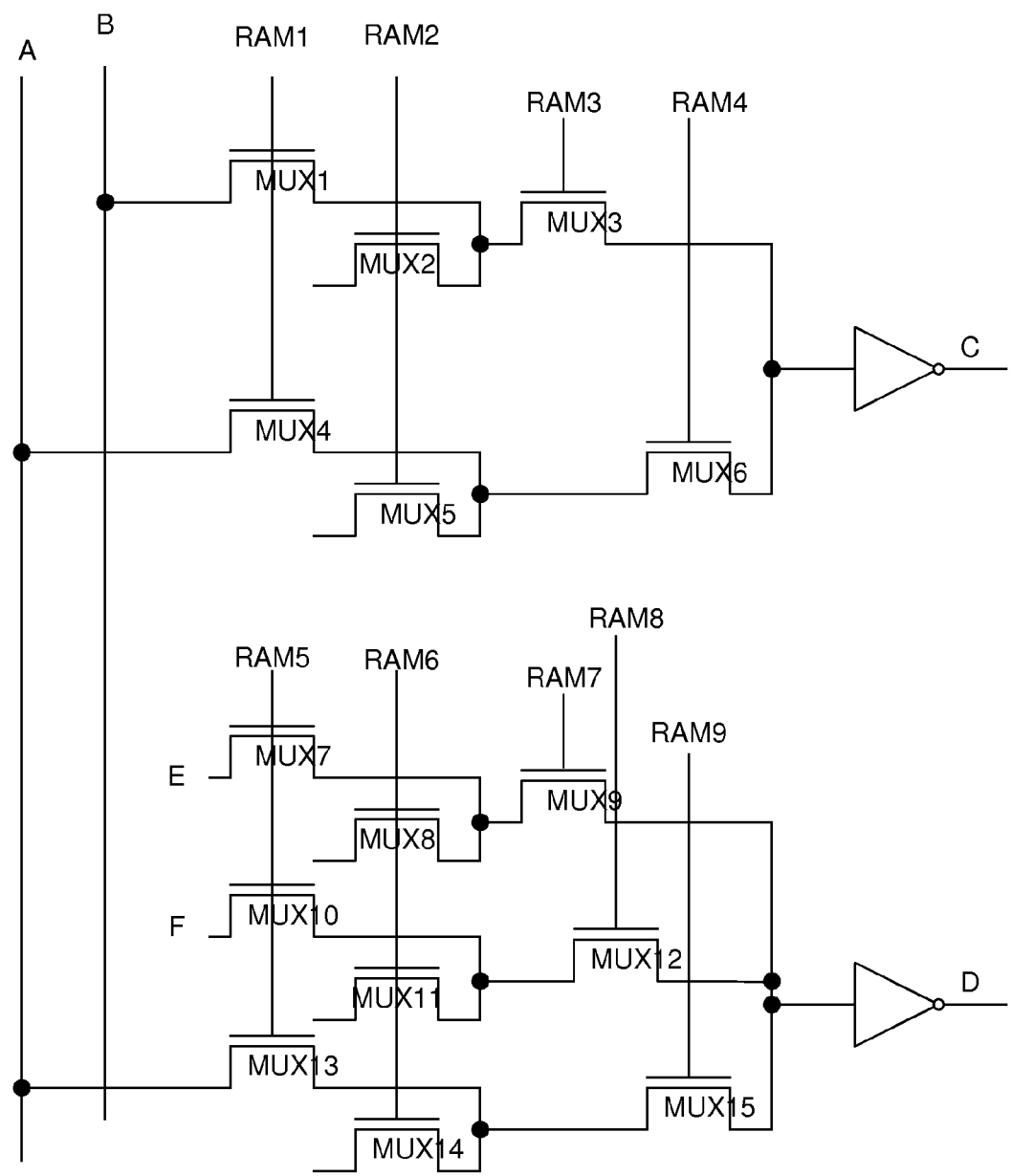
FIG. 5 illustrates an example of parasitic capacitance loading according to an embodiment of the present invention.
Figure 6:
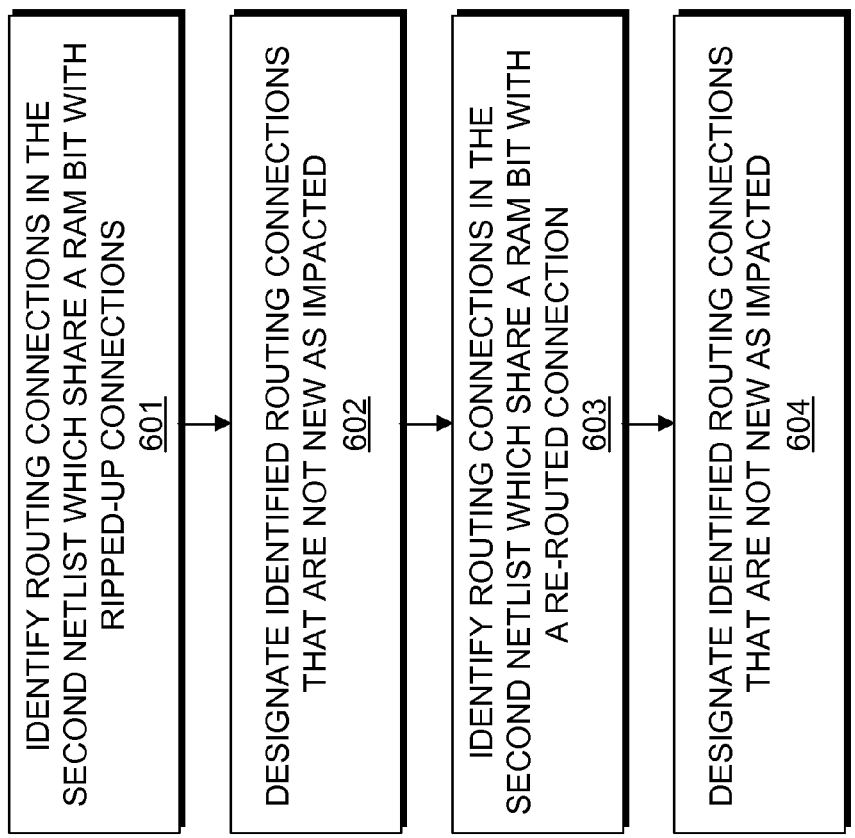
FIG. 6 is a flow chart illustrating a method for performing parasitic capacitance loading difference detection according to an exemplary embodiment of the present invention.

FIG. 5 illustrates an example of parasitic capacitance loading according to an embodiment of the present invention. Interdependence among routing connection may be attributed to parasitic capacitive loading. Thus, according to an embodiment of the present invention, parasitic capacitive loading may be considered when incrementally annotating routing connections. According to one aspect of this embodiment, loading is considered from a two-stage routing multiplexer structure. As illustrated in FIG. 5, to connect from B to C, MUX1 and MUX3 will be turned on by RAM1 and RAM 3. Since MUX1 and MUX4 share RAM1, MUX 4 is also turned on. As a result, A will see additional loading from an ON state of MUX4 and the OFF state of MUX5 and MUX6, illustrating parasitic capacitive loading. Thus, the connection from B to C causes a parasitic capacitive loading effect on unrelated connection A to D. If FIG. 6 illustrated a first system design where connection B to C were removed, or alternatively, if FIG. 5 illustrated a second system design where connection B to C were newly added to a first system design, the delay from A to D should be re-computed. However, since A to D and B to C are unrelated connections, a netlist difference detection procedure alone would not identify a connection from A to D as one to be re-computed.

In the example illustrated in FIG. 5, in order to determine whether a parasitic capacitive loading effects a routing connection, a mapping from a routing connection X to all the routing connections that can potentially drive the routing connection X is identified from a fan-in database. If B to C is a new connection added to a first system design, in order to determine the parasitic capacitance of B to C, the fan-in database is used to identify all possible fan-ins of C which share a RAM bit as the connection from B to C.

It should be appreciated that although a two-stage routing multiplexer is illustrated, the example maybe applied to other multi-staged multiplexers. The RAM used to implement the multiplexer may be a configuration memory bit RAM (CRAM) a static RAM (SRAM), or other device. Furthermore, the identifiers A-D may represent nodes, routing connections, or other points or locations in a system design.

FIG. 6 is a flow chart illustrating a method for performing parasitic capacitance loading difference detection according to an embodiment of the present invention. The procedures illustrated in FIG. 6 may be utilized to implement 303 shown in FIG. 3. At 601, for routing connections identified in a first netlist but not in a second netlist (ripped-up connections), routing connections in the second netlist that share a RAM bit with the ripped-up connections are identified.

At 602, designate the routing connections identified at 501 which are not new to the first netlist (not re-routed connections) as connections that are impacted by parasitic capacitance loading.

At 603, for routing connections identified in the second netlist but not in the first netlist (re-routed connections), routing connections in the second netlist that share a RAM bit with the re-routed connections are identified.

At 604, designate the routing connections identified at 503 which are not new to the first netlist (not re-routed connections) as connections that are impacted by parasitic capacitance.

According to an embodiment of the present invention, if a connection exists in both the ripped-up connection set and the re-routed connection set, it is determined that the parasitic capacitive loading effect from the connection does not have an effect on other routing connections. This reduces the number of routing nets to be re-annotated. According to another embodiment of the present invention, if a first system design includes a routing switch that has 3 or more first stage multiplexers that share a RAM bit, if in a second system design a first routing connection through a first multiplexer is removed and a second routing connection through a second multiplexer is added, it is determined that there will be no change in parasitic capacitive loading on a third routing connection through a third multiplexer in the second system design. Thus with reference to FIG. 5, if a routing connection from E to D is added in the second system design and routing connection from F to D is removed from the first system design, it is determined that there is no change in parasitic capacitive loading on the A to C connection in the second system design. This also reduces the number of routing connections to re-annotate.

FIGS. 1 and 3-4, and 6 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Figure 7:
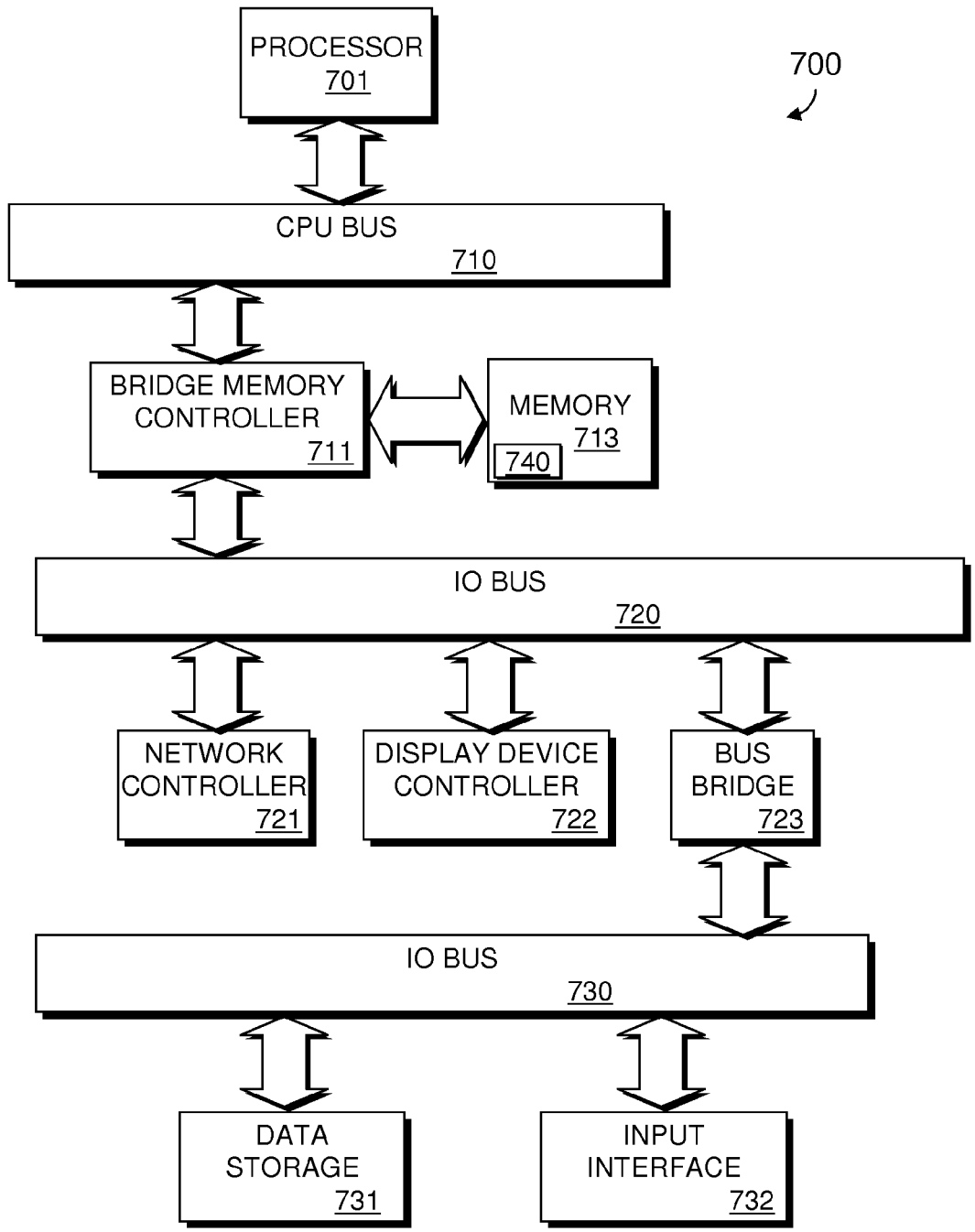
FIG. 7 illustrates an exemplary computer system used to implement the system designer according to an embodiment of the present invention.

FIG. 7 illustrates an exemplary computer system used to implement the system designer according to an embodiment of the present invention. FIG. 7 is a block diagram of an exemplary computer system 700 in which an example embodiment of the present invention resides. The computer system 700 may be used to implement a system designer. The computer system 700 includes a processor 701 that processes data signals. The processor 701 is coupled to a CPU bus 710 that transmits data signals between other components in the computer system 700.

The computer system 700 includes a memory 713. The memory 713 may be a dynamic random access memory device, a static random access memory device, and/or other memory device. The memory 713 may store instructions and code represented by data signals that may be executed by the processor 701. A bridge memory controller 711 is coupled to the CPU bus 710 and the memory 713. The bridge memory controller 711 directs data signals between the processor 701, the memory 713, and other components in the computer system 700 and bridges the data signals between the CPU bus 710, the memory 713, and a first IO bus 720.

The first IO bus 720 may be a single bus or a combination of multiple buses. The first IO bus 720 provides communication links between components in the computer system 700. A network controller 721 is coupled to the first IO bus 720. The network controller 721 may link the computer system 700 to a network of computers (not shown) and supports communication among the machines. A display device controller 722 is coupled to the first IO bus 720. The display device controller 722 allows coupling of a display device (not shown) to the computer system 700 and acts as an interface between the display device and the computer system 700.

A second IO bus 730 may be a single bus or a combination of multiple buses. The second IO bus 730 provides communication links between components in the computer system 700. A data storage device 731 is coupled to the second IO bus 730. The data storage device 731 may be a hard disk drive, a floppy disk drive, a CD-ROM device, a flash memory device or other mass storage device. An input interface 732 is coupled to the second IO bus 730. The input interface 732 may be, for example, a keyboard and/or mouse controller or other input interface. The input interface 732 may be a dedicated device or can reside in another device such as a bus controller or other controller. The input interface 732 allows coupling of an input device to the computer system 700 and transmits data signals from an input device to the computer system 700. A bus bridge 723 couples the first IO bus 720 to the second IO bus 730. The bus bridge 723 operates to buffer and bridge data signals between the first IO bus 720 and the second IO bus 730. It should be appreciated that computer systems having a different architecture may also be used to implement the computer system 700.

According to an embodiment of the present invention, a system designer 740 may reside in memory 713 and be executed by the processor 701. The system designer 740 may operate to synthesize, map, place and route a system on a target device. The system designer 740 may also perform delay annotation and incremental delay annotation on a system design after incremental changes have been made to a base system design.

Figure 8:
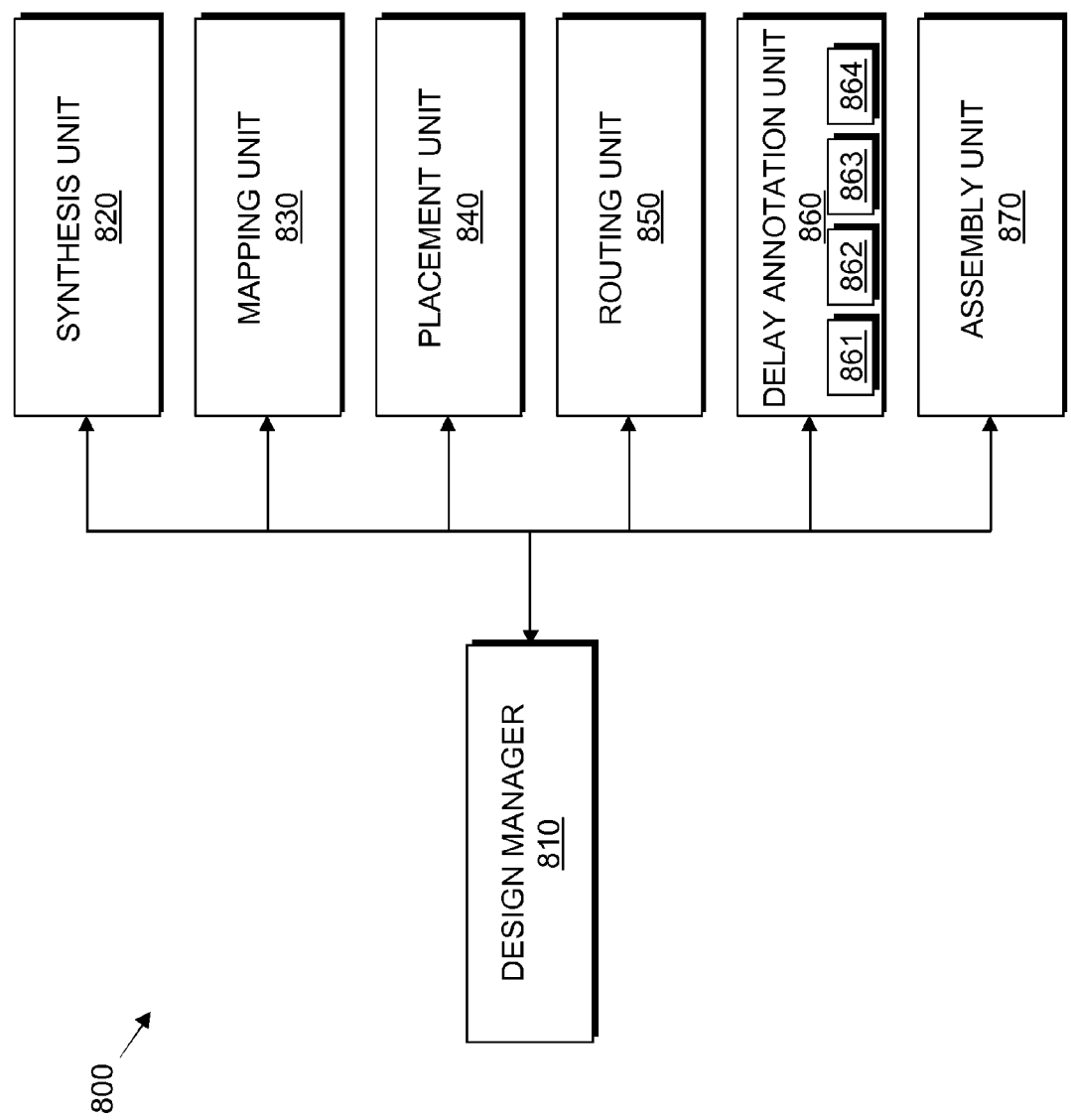
FIG. 8 illustrates a system designer according to an exemplary embodiment of the present invention.

FIG. 8 illustrates a system designer 800 according to an embodiment of the present invention. The system designer 800 may be an EDA tool for designing a system on a target device. The target device may be, for example, a structured ASIC, an FPGA, a PLD, or other circuitry. FIG. 8 illustrates software modules implementing an embodiment of the present invention. According to one embodiment, system design may be performed by a computer system executing sequences of instructions represented by the software modules shown in FIG. 8. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 800 includes a designer manager 810. The designer manager 810 receives a design for a system. The design may be described at a gate level or in a more abstract level. The design may be described in terms of an HDL such as VHDL or Verilog. The designer manager 810 is connected to and transmits data between the components of the system designer 800.

Block 820 represents a synthesis unit that performs synthesis. The synthesis unit 820 generates a logic design of a system to be implemented in the target device. According to an embodiment of the system designer 800, the synthesis unit 820 takes a conceptual HDL design definition and generates an optimized logical representation of the system. The optimized logical representation of the system generated by the synthesis unit 820 may include a representation that has a minimized number of functional blocks and registers, such as logic gates and logic elements, required for the system. Alternatively, the optimized logical representation of the system generated by the synthesis unit 820 may include a representation that has a reduced depth of logic and that generates a lower signal propagation delay.

Block 830 represents a technology mapping unit that performs technology mapping. The technology mapping unit 830 determines how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA or PLD, the technology-mapped netlist may include cells such as LABs, registers, memory blocks, DSP blocks, 10 elements or other components.

Block 840 represents a placement unit that performs placement. The placement unit 840 processes the optimized technology-mapped netlist to produce a placement for each of the functional blocks. According to an embodiment of the present invention for a target device that is a structured ASIC, the placement unit 840 fits the system on the target device by determining which components on the logic design are to be used for specific logic elements, and other function blocks.

Block 850 represents a routing unit that performs routing. The routing unit 850 determines the routing resources on the target device to use to provide interconnection between the components implementing functional blocks and registers of the logic design.

Block 860 represents a delay annotation unit that performing logic cell delay annotation and routing delay annotation on a system design. The design manager 810 may perform timing analysis using the delay information available in the timing database 864. Based upon the timing analysis, the design manager 810 may perform incremental design changes to a netlist of a first system design and direct the placement unit 840 and routing unit 850 to incrementally place and route the changes.

The delay annotation unit 860 includes a fan-in database unit 861 that generates a fan-in database of all routing connections in a system design. The delay annotation unit 860 includes a netlist difference detector 862 that compares a first netlist of a first system design to a second netlist of a second system design to determine routing connections that have been removed from the first netlist (ripped-up connections) and routing connections that have been added to the first netlist (re-routed connections). The netlist difference detector 862 may implement the procedures described with reference to FIG. 3 and FIG. 4. The delay annotation unit 860 includes a parasitic capacitance loading difference detector 863. The parasitic capacitance loading difference detector 863 determines which routing connections and components on the second system design have parasitic capacitance loading impacted by incremental changes made to the first system design. The parasitic capacitance loading difference detector 863 may utilize the procedures described with reference to FIGS. 3 and 6. The routing connections and components in the second system design impacted by the incremental changes have delay information re-calculated (re-annotated) while connections and components that have not been impacted may utilize previously computed delay information from the first system design. The delay information computed by the delay annotation unit 860 may be stored in a timing database 864.

The delay annotation unit 860 reduces compile time by performing delay annotation on parts of the design that are different from a previous delay annotation run. This is useful in incremental CAD flows where a small part of a system design is modified. The modification to the system design may be as a result of optimizing a part of the design due to introducing diagnostic connections into the design or to other reasons where a majority of the design is left undisturbed.

Block 870 represents an assembly unit that performs an assembly procedure that creates a data file that includes the design of the system generated by the system designer 800. The data file may be a bit stream that may be used to program the target device. The assembly unit 870 may output the data file so that the data file may be stored or alternatively transmitted to a separate machine used to program the target device. It should be appreciated that the assembly unit 870 may also output the design of the system in other forms such as on a display device or other medium.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for determining delay for a system on a target device, the method comprising:
   identifying components and routing connections associated with system design changes by comparing a first netlist reflecting a synthesis, placement, and routing of an original system design with a second netlist reflecting a synthesis, placement, and routing of a modified system design; and
   annotating delays for the components and routing connections identified while utilizing delays previously computed for components and routing connections not impacted by the system design changes for annotating delays thereof.

2. The method of claim 1, wherein comparing the first netlist with the second netlist comprises comparing an identity of components and routing connection from the first and the second netlists.

3. The method of claim 1, wherein comparing the first netlist with the second netlist comprises comparing a location of components and routing connection from the first and the second netlists.

4. The method of claim 1, wherein comparing the first netlist with the second netlist comprises comparing connection data of components and routing connection from the first and the second netlists.

5. The method of claim 1, wherein identifying components and routing associated with system design changes comprises determining whether parasitic capacitive loading has been changed on the original system design.

6. The method of claim 5, wherein determining whether parasitic capacitive loading has been changed comprises:
   identifying a routing connection that has been modified in the original system design;
   identifying a resource outside the routing connection that drives a resource on the routing connection; and
   designating all components and routing connections driven by the resource outside the routing connection as having its parasitic capacitive loading changed.

7. The method of claim 5, wherein determining whether parasitic capacitive loading has been changed comprises:
   for each added routing connection to the original system design, determining whether any fan-ins to the added routing connection share a RAM bit with the added routing connection; and
   identifying a routing connection driven by any of the fan-ins to the added routing connection that share the RAM bit as having its parasitic capacitive loading changed.

8. The method of claim 5, wherein determining whether parasitic capacitive loading has been changed comprises:

for each removed routing connection from the original system design, determining whether any fan-ins to the removed routing connection share a RAM bit with the removed routing connection; and identifying a routing connection driven by any of the fan-ins to the removed routing connection that share the RAM bit as having its parasitic capacitive loading changed.

9. The method of claim 7 further comprising identifying the routing connection as having its parasitic capacitive loading unchanged if the routing connection was originally present in the original system design.

10. The method of claim 7 further comprising identifying the routing connection as having its parasitic capacitive loading unchanged if the RAM bit was also shared by a routing connection that was removed by the design change.

11. The method of claim 1 further comprising:
computing a checksum value for the second netlist;
storing the checksum value with new information used for annotating the delays in a timing database; and
validating the timing database for use with another netlist in response to determining that the checksum value of the another netlist is the same as the checksum value.

12. A non-transitory computer readable medium including a sequence of instructions stored thereon for causing a computer to execute a method comprising:
identifying components and routing connections associated with design changes made to a system design by comparing a first netlist reflecting the placement and routing of the system design with a second netlist reflecting the placement and routing of a modified system design;
computing new information to annotate delays for the components and routing connections identified; and
utilizing delays previously computed for components and routing connections that have not been impacted by the design changes to annotate delays for the components and the routing connections that have not been impacted by the design changes.

13. The non-transitory computer readable medium of claim 12, wherein comparing the first netlist with the second netlist comprises comparing an identity of components and routing connection from the first and the second netlists.

14. The non-transitory computer readable medium of claim 12, wherein comparing the first netlist with the second netlist comprises comparing a location of components and routing connection from the first and the second netlists.

15. The non-transitory computer readable medium of claim 12, wherein comparing the first netlist with the second netlist comprises comparing connection data of components and routing connection from the first and the second netlists.

16. The non-transitory computer readable medium of claim 12, wherein identifying components and routing connections impacted by the design changes made to the system design further comprises determining whether parasitic capacitive loading has been changed on the system design.

17. A system comprising:
a synthesis unit operable to generate a design for a system;
a mapping unit operable to implement the design with components available on a target device;
a placement unit operable to determine components on the target device to assign to the system;
a routing unit operable to determine routing resources on the target device to assign to connect the components; and
a delay annotation unit operable to identify components and routing connections associated with system design changes based on parasitic capacitance loading, and operable to compute new information used for annotating delays for the components and routing connections identified while utilizing delays previously computed for components and routing connections that have not been impacted by the design changes to annotate delays for the components and the routing connections that have not been impacted by the design changes.

18. The system designer of claim 17, wherein the delay annotation unit comprises a netlist difference detector operable to compare a first netlist associated with the system design with a second netlist associated with a modified system design to identify routing connections that have been removed from the first netlist and routing connections that have been added to the first netlist.

19. The system designer of claim 17, wherein the delay annotation unit comprises a parasitic capacitance loading difference detector operable to identify the components and the routing connections having parasitic capacitance loading impacted by the design changes.

20. The system designer of claim 17, wherein the delay annotation unit comprises a timing database operable to store the new information with a checksum value computed from the second netlist.

* * * * *